United States Patent [19]

Revesz et al.

[11] 3,904,453

[45] Sept. 9, 1975

[54] FABRICATION OF SILICON SOLAR CELL WITH ANTI REFLECTION FILM

[75] Inventors: Akos George Revesz, Bethesda; Robert John Dendall, Gaithersburg, both of Md.

[73] Assignee: Communications Satellite Corporation (COMSAT), Washington, D.C.

[22] Filed: Aug. 22, 1973

[21] Appl. No.: 390,672

[52] U.S. Cl. .................... 156/3; 117/212; 117/217; 156/8; 156/18

[51] Int. Cl. ........ B44d 1/16; B44d 1/18; C23f 1/00

[58] Field of Search ...... 117/217, 212, 8, 221, 33.3; 156/17, 3, 8, 18, 11; 317/235 N; 96/36.2, 38.4

[56] References Cited

UNITED STATES PATENTS

| | | | |
|---|---|---|---|
| 3,135,638 | 6/1964 | Cheney et al. | 156/11 |
| 3,442,701 | 5/1969 | Lepselter | 117/212 |
| 3,533,850 | 10/1970 | Tarneja et al. | 317/235 N |
| 3,539,883 | 11/1970 | Harrison | 317/235 N |
| 3,567,508 | 3/1971 | Cox et al. | 96/36.2 |

*Primary Examiner*—Cameron K. Weiffenbach
*Attorney, Agent, or Firm*—Sughrue, Rothwell, Mion, Zinn, & Macpeak

[57] ABSTRACT

A solar cell is fabricated having an anti-reflective coating formed of an oxide of niobium, zirconium, hafnium, or tantalum. The oxide is formed by oxidizing a layer of metal deposited on the surface of the semiconductor portion of the solar cell. A pattern for the top electrode of the solar cell is etched into the oxide layer by a technique which includes the formation of a metallic and a photoresist mask and also includes lift-off photolithography.

8 Claims, 12 Drawing Figures

FABRICATION OF SILICON SOLAR CELL WITH ANTI REFLECTION FILM

BACKGROUND OF THE INVENTION

The present invention is in the field of solar cells and specifically is directed to a method for forming the anti-reflective coating and top metallic electrode of a solar cell.

Recent advances in the solar cell art include the formation of a fine line metallic electrode on the upper surface of the solar cell (described in U.S. patent application Ser. No. 184,393 to Lindmayer, filed Sept. 28, 1971, entitled "Fine Geometry Solar Cell", now U.S. Pat. 3,811,954 issued May 21, 1974 and improvements in anti-reflective coatings and methods for forming the anti-reflective coatings on solar cells (described in the U.S. patent applications:

1. Lindmayer et al, Ser. No. 249,024, filed June 1, 1972, entitled "Tantalum Pentoxide Anti-Reflective Coating", subsequently abandoned in favor of Continuation application Ser. No. 438,840, filed Feb. 1, 1974.
2. Revesz et al, Ser. No. 331,741, filed Feb. 13, 1973, entitled "Niobium Pentoxide Anti-Reflective Coating."
3. Lindmayer et al, Ser. No. 331,739, filed Feb. 13, 1973, entitled "Method of Applying an Anti-Reflective Coating to a Solar Cell."

SUMMARY OF THE INVENTION

In accordance with the present invention a novel method of forming the anti-reflective coating and upper electrode is provided having certain advantages over the other methods. In accordance with the present invention, the metallic layer is oxidized and subsequently etched by a specific etching technique to form a pattern for the electrode. The electrode preferably consists of gold-chromium and an electroplated coating of silver. The etching technique includes depositing a masking metal over the oxide, depositing a photoresist over the masking metal, forming a pattern of openings in said photoresist, etching a corresponding pattern of openings in said masking metal, and subsequently etching corresponding openings in said oxide. The process of the invention minimizes the possibility of contamination of the n-p junction by avoiding exposure of the device to elevated temperatures while the n-p junction is susceptible to contamination.

DETAILED DESCRIPTION OF THE PREFERRED EMBODIMENT

Although the method of the present invention is not limited solely to silicon solar cells and is not limited solely to the fine geometry type solar cells described in U.S. Pat No. 3,811,954 mentioned above, the invention will nonetheless be described in connection with a fine geometry silicon solar cell of the type therein described.

Figure 1:
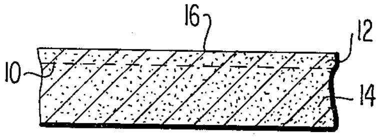
FIGS. 1 through 12 illustrate cross-sectional views of the solar cell during successive steps in the fabrication technique of the present invention.
Figure 2:
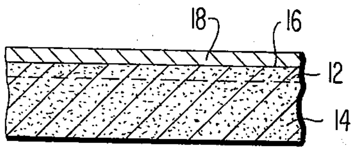

Referring to FIG. 1 there is shown a silicon semiconductor material having a p-n junction 10 therein dividing a p-type region 12 from an n-type region 14. The p-n junction 10 is near the surface 16 which represents the upper surface. As is well known, the upper surface is the surface which is intended to be exposed to sunlight. The upper surface is carefully cleaned and the device of FIG. 1 is inserted into a conventional vacuum system wherein a metallic film 18, as shown in FIG. 2, is deposited onto the surface 16. The metal deposited is either niobium, tantalum, hafnium, or zirconium. The deposition is performed preferably by electron-gun evaporation of a high purity metal in a high vacuum to deposit a layer of metal having a thickness of about 200 A. It should be noted, however, that the thickness of the metal, and the later described thickness of the metal oxide, depends entirely upon the optical properties desired, as is well known in the art. Methods other than electron-gun evaporation are also suitable for deposition of the metal layer. However, the electron-gun method is preferred because it is the cleanest method for depositing a high purity metal.

Figure 3:
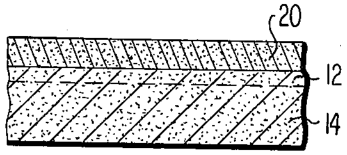

Next, the metal layer 18 is oxidized to form the oxide layer 20, as illustrated in FIG. 3. Depending upon the metal used, the oxide layer will be either niobium pentoxide, tantalum pentoxide, zirconium dioxide, or hafnium dioxide. The oxidation step is performed in a clean furnace and conducted at a temperature, pressure and for a duration sufficient to provide an oxide layer having a thickness of approximately 550 A. The oxidizing ambient, temperature and time are carefully selected so that the oxide film is uniform and non-crystalline (without grain boundaries). A typical set of oxidation parameters for producing $Nb_2O_5$ are: pressure of 1 atmosphere, temperature of 400°C., and a duration of 15 minutes. A temperature range of 300° to 500° C. seems to be acceptable. As will be appreciated by anyone skilled in the art, the higher the temperature used the shorter the oxidation duration needed to achieve a given thickness.

Figure 4:
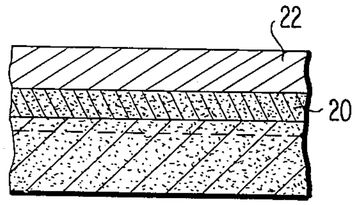
Figure 5:
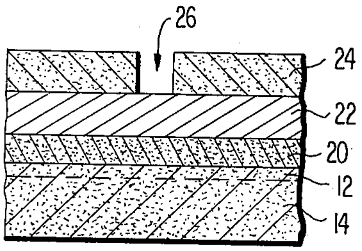

The next step, as illustrated in FIG. 4, is to deposit a layer of masking metal 22 on top of the oxide 20. The particular metal selected is important, as will be pointed out later. A preferable metal is silver, but aluminum and chromium would also be applicable. One of the problems in using chromium, however, is that chromium is fairly difficult to etch. The metal may be deposited by any conventional method, for example, electron contact deposition, resistance evaporation, sputtering, or RF evaporation. It has been found that a silver layer having a thickness of 1,000 to 5,000 A. is suitable. However, the thickness is not critical since the metallic layer deposited in this step is used only as a mask. In the next step, as illustrated in FIG. 5, a layer of appropriate photoresist material 24 is formed on the metal layer 22. The photoresist is exposed through a conventional mask, developed, rinsed and baked so that in the regions 26 the photoresist will be removed. Various techniques for forming a photoresist layer 24 in a desired pattern are well known in the art. Also, many suitable photoresists are available commercially. The two basic types are negative photoresists and positive photoresists. When using one type, the area to be removed is exposed to light, whereas when using the other type, the area of the photoresist which is to remain is exposed to light. The pattern of the removed areas 26 corresponds to the desired pattern of the upper electrode of the solar cell. Thus, assuming a positive photoresist is used, the photoresist layer is exposed to light through a conventional mask having transparent portions corresponding in geometry to the desired patterns of the upper electrode. The photoresist is then developed, rinsed and baked so that the exposed portions thereof will be removed and the unexposed portions thereof will remain on top of metal layer 22. Examples of suitable photoresists for use in accordance with the present method are: AZ 1350(*b*) manufactured by Shipley Company, KAR manufactured by Kodak, KPR manufactured by Kodak, AZ 1350(*j*) manufactured by Shipley, and AZ111 manufactured by Shipley. The particular characteristic necessary for the photoresist to be suitable in the process of the present invention is that it must adhere well enough to the underlying metal layer (for example, silver, aluminum, or chromium) so that the etchant will be subsequently used to etch the anti-reflective coating will not attack the interface and therefore will not lift-off the photoresist. It should be noted that the adherence of photoresists to the oxide coating 20 is relatively weak and those chemical etchants which are suitable for etching the oxide layer 20 would lift-off the photoresist. Consequently, the photoresist is not placed directly on top of the oxide, but instead is placed on the metal layer 22 which in turn is placed on the oxide 20. Stated otherwise, if the metal layer 22 were not used, the chemical etchant applied through the photoresist for the purpose of etching the oxide 20 would have the deleterious effect of lifting the photoresist off of the oxide thereby preventing the etchant from etching only the selected regions of the oxide.

Figure 6:
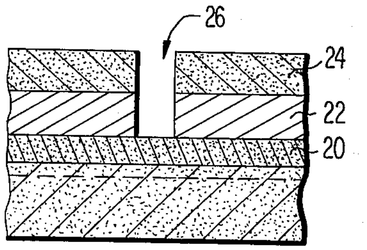

The next step, as illustrated in FIG. 6, is to etch the metal layer 22 through the openings in photoresist 24. Etchants which will etch the metals and will not affect the photoresist are known in the art. For example, if layer 22 is metallic silver, the etchant may be a dilute nitric acid solution or a dilute ferric nitrate, 55° by weight solution, used at 110°F. If the layer 22 is metallic aluminum a PN etch may be used. The latter type etching solution is well known in the industry and consists of phosphoric acid and nitric acid.

Figure 7:
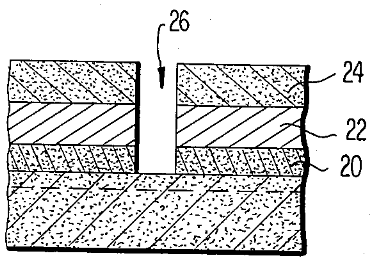

Next, as illustrated in FIG. 7, the anti-reflective coating oxide layer 20 is etched through the openings 26 in the photoresist 24 and the metal layer 22. The etchant used is preferably a mixture of hydrofluoric acid in water. The hydrofluoric acid solution should include a fairly strong concentration of HF. It should be noted that the latter solution is strong enough to etch the anti-reflective coating oxide layer but will not attack the interface between the metal and the oxide layer and will not attack the interface between the metal and the photoresist. On the other hand, as explained above, if the metal layer had not been used, the etchant solution would attack the interface between the photoresist and the oxide layer thereby removing the photoresist layer.

Figure 8:
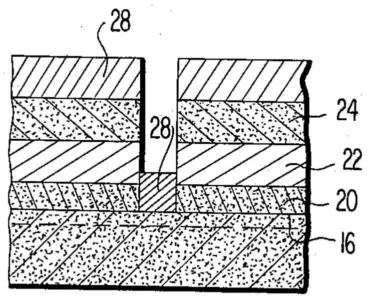

After the proper pattern of openings 26 has been formed in the anti-reflective coating oxide layer, a single or composite metal film 28, which constitutes the metallic material for forming the grid electrode, is deposited on the entire surface as illustrated in FIG. 8. As will be appreciated, the metal 28, will deposit directly on the silicon surface 16 in the regions corresponding to openings 26 and will deposit directly onto the photoresist layer 24 in all other regions. The metal 28 and its thickness must be selected in such a manner that the subsequent etching of masking metal film 22 will not damage the front electrode contact or its adhesion to the silicon. It has been found that an electrode of chromium-gold composite film is compatable with either silver, aluminum, or chromium, as the masking metal 22. Rhodium may also be used as the electrode metal. The specific technique for depositing the front electrode metal, insofar as the deposition rates, temperatures, duration, and materials are concerned, is described in the above-mentioned application entitled "Fine Geometry Solar Cells." Generally, a few angstroms of chromium are first deposited followed by the deposition of a combination of gold and chromium, followed by a deposition of a few angstroms of gold alone.

Figure 9:
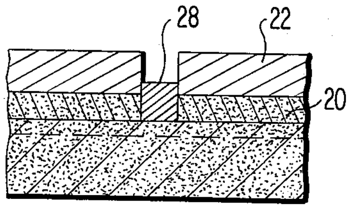
Figure 10:
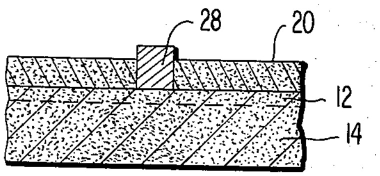
Figure 11:
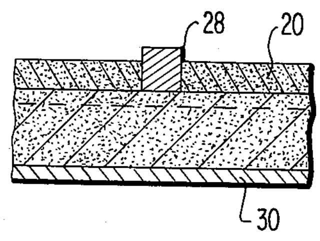
Figure 12:
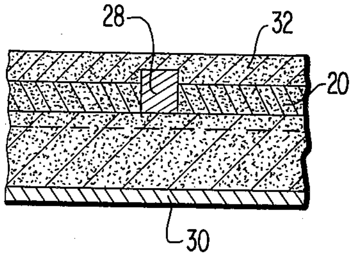

Next, as illustrated in FIG. 9, the metal layer 28 which overlies photoresist layer 24, along with the photoresist layer 24 are removed by a technique known in the art as lift-off photolithography. A description of this technique is described in the above-mentioned patent application entitled "Fine Geometry Solar Cells." The metal masking layer 22 is then removed, as indicated in FIG. 10 by means of an etching solution applied thereto. The same etching solution which was applied to etch opening 26 in metal layer 22 may also be applied in this step to remove the remainder of metal layer 22. During this etching step, the electrode 28 will not be harmed because metallic gold, which constitutes the upper surface portion thereof, is impervious to the etchants used as well as most other etchants. FIGS. 11 and 12 show the steps of depositing the back contact metal 30, as is well known in the art, and the addition of a cover slide 32 for protecting the solar cell against harmful radiation as is well known in the art (FIG. 12.)

It will be appreciated from the above description that the masking metal 22 is carefully selected and meets the following requirements:

*a.* the masking metal reasonably adheres to the oxide film so that it stays there during etching but can be removed later;

*b.* a pattern can be etched in the masking metal using a photoresist without affecting the oxide anti-reflective film or the adhesion between the oxide and the masking metal;

*c.* the masking metal is insoluble in the HF — $H_2O$ mixture used for etching the oxide film; and

*d.* the masking metal can be removed without damaging the front contact and the oxide film.

What is claimed is:

1. A method of forming an anti-reflective coating and metallic electrode on the top semiconductor surface of a solar cell comprising the steps of:

a. depositing a layer of metal selected from the group consisting of Nb, Ta, Zr, and Hf on said top surface, b. oxidizing said layer of metal to form an anti-reflective layer, c. depositing a layer of masking metal on said anti-reflective layer, said masking metal being selected from the group consisting of silver, aluminum and chromium, d. forming a layer of photoresist on top of said masking metal, e. forming a pattern of openings in said photoresist corresponding to the desired pattern of said metallic electrode, f. etching said masking metal through the openings in said photoresist to form corresponding openings in said masking metal, g. etching said anti-reflective layer through the openings in said photoresist and said masking metal to form corresponding openings in said anti-reflective coating, h. depositing a layer of electrode metal for forming said electrode onto the surface of said photoresist and said semiconductor where the latter is exposed by said openings, at least a top surface of said electrode metal being selected from the group consisting of gold and rhodium, i. removing said photoresist layer and the portion of said electrode metal layer overlying said photoresist layer, and j. removing said masking metal by applying an etching solution to said device which will etch said masking metal but will not etch said electrode metal remaining in said opening.

2. The method as claimed in claim 1 wherein said masking metal is selected to form interfaces with said anti-reflective layer and said photoresist which interfaces will withstand attack by an etchant used in the etching of said anti-reflective layer.

3. The method as claimed in claim 1 wherein said masking metal is silver.

4. The method as claimed in claim 1 wherein the step of etching said anti-reflective layer comprises exposing the device having openings in the metallic masking and photoresist layers to an etching solution of hydrofluoric acid.

5. The method as claimed in claim 1 wherein said layer of metal for forming said electrode has an upper surface of metallic gold.

6. The method as claimed in claim 1 wherein said layer of metal deposited on said top surface is niobium and said anti-reflective layer formed by the oxidation of said layer of metal is niobium pentoxide.

7. The method as claimed in claim 1 wherein said layer of metal deposited on said top surface is tantalum and said anti-reflective layer formed by the oxidation of said layer of metal is tantalum pentoxide.

8. The method as claimed in claim 1 wherein said masking metal is silver, the step of etching said anti-reflective layer comprises applying a solution of hydrofluoric acid to the portions of said anti-reflective layer exposed through said openings, and wherein said electrode metal comprises gold and chromium with the top surface thereof being gold.

* * * * *

UNITED STATES PATENT OFFICE

CERTIFICATE OF CORRECTION

PATENT NO. : 3,904,453

DATED : September 9, 1975

INVENTOR(S) : Akos George REVESZ and Robert John DENDALL

It is certified that error appears in the above-identified patent and that said Letters Patent are hereby corrected as shown below:

Delete the present title and insert the following:

--FABRICATION OF SILICON SOLAR CELL WITH ANTI-REFLECTION FILM-- .

Column 1, Line 3, delete "ANTI REFLECTION", and insert --ANTI-REFLECTION-- .

Column 3, Line 14, after "etchant", insert --which--.

Column 3, Line 35, delete "55°", and insert --55%--.

Signed and Sealed this

*sixth* Day of *January 1976*

[SEAL]

*Attest:*

RUTH C. MASON
*Attesting Officer*

C. MARSHALL DANN
*Commissioner of Patents and Trademarks*